(12) United States Patent
Overhauser (10) Patent No.: US 8,316,336 B1
(45) Date of Patent: *Nov. 20, 2012

(54) METHOD AND MECHANISM FOR MODELING INTERCONNECT STRUCTURES FOR INTEGRATED CIRCUITS

(75) Inventor: David Overhauser, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 163 days.

This patent is subject to a terminal disclaimer.

(21) Appl. No.: 12/643,813

(22) Filed: Dec. 21, 2009

Related U.S. Application Data (62) Division of application No. 11/404,636, filed on Apr. 13, 2006, now Pat. No. 7,653,519.

(51) Int. Cl.
| | |
|---|---|
| G06F 17/50 | (2006.01) |
| G06F 19/00 | (2011.01) |
| H03K 17/16 | (2006.01) |
| H03K 19/00 | (2006.01) |
| H01L 25/00 | (2006.01) |
| H01L 29/30 | (2006.01) |
| H01L 39/00 | (2006.01) |
| H01L 23/48 | (2006.01) |
| H01L 23/52 | (2006.01) |

(52) U.S. Cl. ........ 716/122; 716/123; 716/129; 716/130; 716/136; 716/111; 716/54; 716/55; 716/51; 326/31; 326/41; 326/47; 326/101; 257/618; 257/662; 257/663; 257/758

(58) Field of Classification Search ............ 716/54, 716/55, 51, 111, 136, 122, 123, 129, 130; 326/31, 41, 47, 101; 257/618, 662, 663, 257/758

See application file for complete search history.

(56) References Cited

U.S. PATENT DOCUMENTS

| | | | |
|---|---|---|---|
| 5,258,920 A * | 11/1993 | Haller et al. | 716/130 |
| 6,034,542 A * | 3/2000 | Ridgeway | 326/39 |
| 6,057,171 A * | 5/2000 | Chou et al. | 438/15 |
| 6,174,741 B1 | 1/2001 | Hansch et al. | |
| 6,291,254 B1 * | 9/2001 | Chou et al. | 438/18 |
| 6,312,963 B1 * | 11/2001 | Chou et al. | 438/18 |
| 6,403,389 B1 * | 6/2002 | Chang et al. | 438/18 |
| 6,487,706 B1 * | 11/2002 | Barkley et al. | 716/112 |
| 7,078,928 B2 * | 7/2006 | Sahara et al. | 326/16 |
| 7,107,566 B1 * | 9/2006 | McElheny | 716/117 |
| 7,124,386 B2 | 10/2006 | Smith et al. | |
| 7,152,215 B2 | 12/2006 | Smith et al. | |
| 7,174,520 B2 | 2/2007 | White et al. | |
| 7,207,020 B1 * | 4/2007 | Fung et al. | 716/113 |

(Continued)

OTHER PUBLICATIONS

Chao et al, "An Extraction Method to Determine Interconnect Parasitic Parameters", IEEE Transactions on Semiconductor Manufacturing, vol. 11, No. 4, Nov. 1998.

(Continued)

*Primary Examiner* — Phallaka Kik
(74) *Attorney, Agent, or Firm* — Vista IP Law Group, LLP (57) ABSTRACT

Disclosed are methods, systems, and structures for implementing interconnect modeling by using a test structure which include a variation of physical wire structures between local interconnects and distant interconnects. According to one approach, the impact of variations of the physical properties for neighborhood wires are considered for the electrical modeling of interconnects. This variation between the local and distant wire characteristics allows more accurate and robust interconnect modeling to be created.

20 Claims, 6 Drawing Sheets

U.S. PATENT DOCUMENTS

| | | | |
|---|---|---|---|
| 7,243,316 | B2 | 7/2007 | White et al. |
| 7,325,206 | B2 | 1/2008 | White et al. |
| 7,339,256 | B2 * | 3/2008 | Nakamura et al. ............ 257/659 |
| 7,353,475 | B2 | 4/2008 | White et al. |
| 7,373,627 | B2 * | 5/2008 | Shigyo et al. ................. 716/115 |
| 7,577,933 | B1 * | 8/2009 | Wu et al. ....................... 716/119 |
| 7,620,925 | B1 * | 11/2009 | Manohararajah et al. .... 716/138 |
| 7,721,236 | B2 * | 5/2010 | Hwang et al. ................. 716/113 |
| 7,823,114 | B2 * | 10/2010 | Shigyo et al. ................. 716/130 |
| 7,966,598 | B2 * | 6/2011 | Polomik et al. ............... 716/130 |
| 2002/0163063 | A1 * | 11/2002 | Noguchi et al. .............. 257/666 |
| 2003/0011038 | A1 * | 1/2003 | Kida ............................ 257/459 |
| 2003/0228714 | A1 | 12/2003 | Smith et al. |
| 2003/0229410 | A1 | 12/2003 | Smith et al. |
| 2003/0229881 | A1 | 12/2003 | White et al. |
| 2005/0037522 | A1 | 2/2005 | Smith et al. |
| 2005/0039156 | A1 * | 2/2005 | Catthoor et al. ................ 716/18 |
| 2005/0051809 | A1 | 3/2005 | Smith et al. |
| 2005/0132306 | A1 | 6/2005 | Smith et al. |
| 2005/0167842 | A1 * | 8/2005 | Nakamura et al. ............ 257/758 |
| 2005/0196964 | A1 | 9/2005 | Smith et al. |
| 2005/0235246 | A1 | 10/2005 | Smith et al. |
| 2007/0103199 | A1 * | 5/2007 | Tzartzanis et al. .............. 326/82 |
| 2007/0136706 | A1 * | 6/2007 | Hwang et al. ..................... 716/6 |

OTHER PUBLICATIONS

Doong et al, "Infrastructure Development and integration of Electrical-Based Dimensional Process Window Checking", IEEE Transactions on Semiconductor Manufacturing, vol. 17, No. 2, May 2004.

Oh et al, "Interconnect Modeling for VLSI's", International Conference on Simulation of Semiconductor Processes and Devices, pp. 203-206, Sep. 6-8, 1999.

Stine et al, "Rapid Characterization and Modeling of Pattern-Dependent Variation in Chemical-Mechanical Polishing", IEEE Transactions on Semiconductor Manufacturing, vol. 11, No. 1, Feb. 1998.

Kleveland et al, "High-Frequency Characterization of On-Chip Digital Interconnects", IEEE Journal of Solid-State Circuits, vol. 37, No. 6, Jun. 2002.

* cited by examiner

METHOD AND MECHANISM FOR MODELING INTERCONNECT STRUCTURES FOR INTEGRATED CIRCUITS

CROSS REFERENCED TO RELATED APPLICATIONS

This application is a divisional of U.S. application Ser. No. 11/404,636, now U.S. Pat. No. 7,653,519 filed on Apr. 13, 2006, the content of which is hereby incorporated by reference in its entirety.

BACKGROUND

The invention relates to technology for designing and verifying an integrated circuit ("IC") design.

An IC has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information, for example, of circuit primitives such as transistors and diodes, their sizes and interconnections.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

Common electrical characteristics that are extracted from an integrated circuit layout include capacitance and resistance of the various "nets" (electrical interconnects) in the integrated circuit. These electrical characteristics are sometimes referred to as "parasitic" since these are electrical characteristics are not intended by the designer but result from the underlying physics of the integrated circuit design. For example, when an integrated circuit designer wishes to connect two different locations of an integrated circuit with an electrical conductor, the electrical circuit designer would ideally like perfect conductor with zero resistance and zero capacitance. However, the geometry of a real conductor, its material composition, and its interaction with other nearby circuit elements will create some parasitic resistance and parasitic capacitance. The parasitic resistance and parasitic capacitance affect the operation of the designed integrated circuit. Thus, the effect of the parasitic resistance and parasitic capacitance on the electrical interconnect must be considered.

To test an integrated circuit layout, the integrated circuit designer 'extracts' parasitic resistance and parasitic capacitance from the integrated circuit layout using an extraction application program. Then, the integrated circuit designer analyzes and possibly simulates the integrated circuit using the extracted parasitic resistance and parasitic capacitance information. If the parasitic resistance or parasitic capacitance causes undesired operation of the integrated circuit, then the layout of the integrated circuit must be changed to correct the undesired operation. Furthermore, minimizing the amount of parasitic resistance and parasitic capacitance can optimize the performance of the integrated circuit by reducing power consumption or increasing the operating speed of the integrated circuit.

Electrical models are often used in the process of extracting the electrical characteristics of an integrated circuit design. One approach that has been taken to model interconnect structures, such as wires, is to use a test chip having a test structure with a consistent array of wires. The array of consistent wires may be over an entire test chip, or there may be many different test structures with consistent arrays of wires on a test chip. The electrical performance of the test structure (s) is measured to form the underlying data for the interconnect models. The models are then used to verify and predict the electrical behavior of a given IC design.

One problem with this approach is that a test structure having a consistent array of wires may not correspond very well to a real-world IC design, which may have a large number of physical variations for its wires. In this case, variations in the physical structure of neighboring wires may not be properly accounted for when measuring the physical and electrical properties of the wires. As a result, the model formed from such a test structures may not accurately reflect the true electrical characteristics of an actual IC design. This lack of accuracy may result in faulty verification results for a given IC design, which could cause a failure of that design once it has been implemented as a commercial product.

SUMMARY

Some embodiments of the present invention provide an improved method and system for modeling the electrical behavior of interconnect structures. Some embodiments of the present invention address the problems of the prior solutions by using a test structure which include a variation of physical wire structures between local interconnects and distant interconnects. Other and additional objects, features, and

DETAILED DESCRIPTION

Modeling of electrical properties for interconnects on an IC is a critical aspect of IC design and verification. If the basis for the IC design and analysis is flawed, then the results of the design and verification process may be flawed as well.

Some embodiments of the present invention address the problems of the prior solutions by using a test structure which include a variation of physical wire structures between "local" interconnects and "distant" interconnects. Local interconnects are the interconnects that are measured to build a model. Distant interconnects are the remote interconnects that are non-local, and are used to build the environment surrounding the local interconnects. According to some embodiments of the invention, the impact of variations of the physical properties for neighborhood wires are considered for the electrical modeling of interconnects. This variation between the local and distant wire characteristics allows more accurate and robust interconnect modeling to be created.

A test chip may include one or more test structures. Each test structure includes a pattern of local and distant interconnects. There may be one or more local interconnects in a test structure. In an exemplary embodiment, there are at least three local interconnects. There may be any number of distant interconnects in the test structure. In an exemplary embodiment, a plurality of distant interconnects are on either side of the local interconnect(s).

Figure 1:
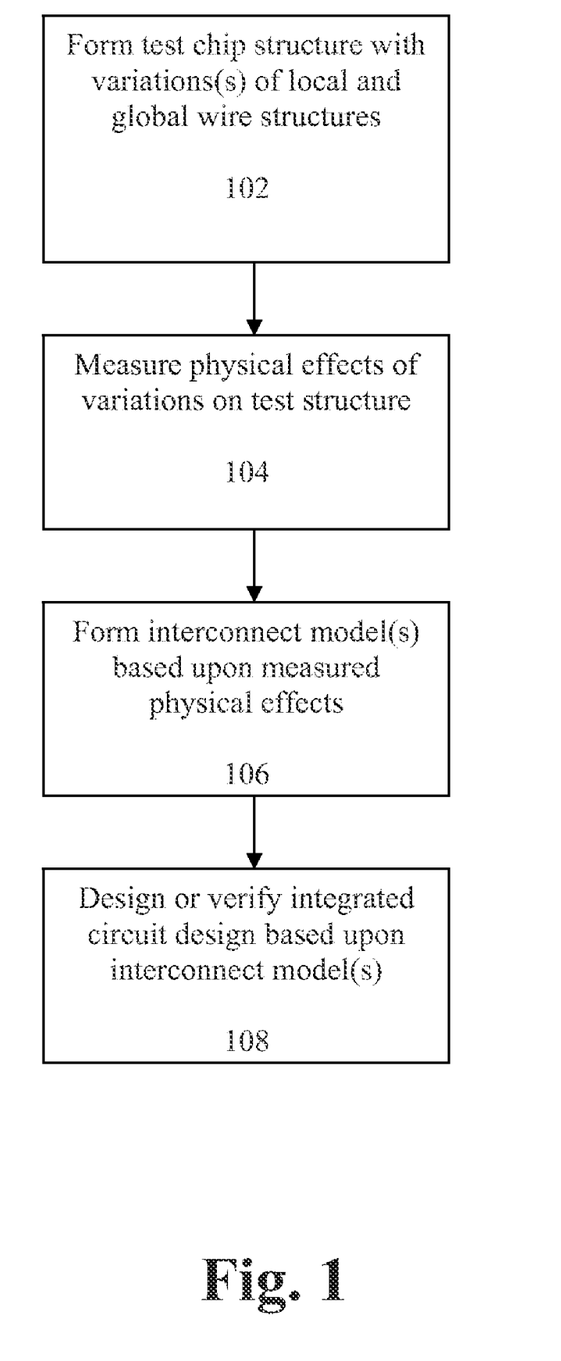
FIG. 1 is a process flow of a process for performing interconnect modeling according to an embodiment of the invention.

FIG. 1 is a process flow of an embodiment of the present invention. At 102, the process implements a test structure with variations(s) of local and distant wire structures. Rather than having a consistent array of wires across the entire test structure or a consistent array of wires across different substantial portions of the test structure, an intentional variation of the physical properties between the local and distant wires is formed on the test structure.

At 104, physical measurements are taken of the electrical properties of the test interconnects. If the variations of the local and distant wires produce physical effects, then those physical effects are measured and accounted for at 104.

The measurement results from 104 are used to form interconnect model(s) at 106. These interconnect models allow IC designers to predict the electrical and timing characteristics of wire structures that appear in IC designs. At 108, designers use the models to design or verify an IC design.

Figure 2:
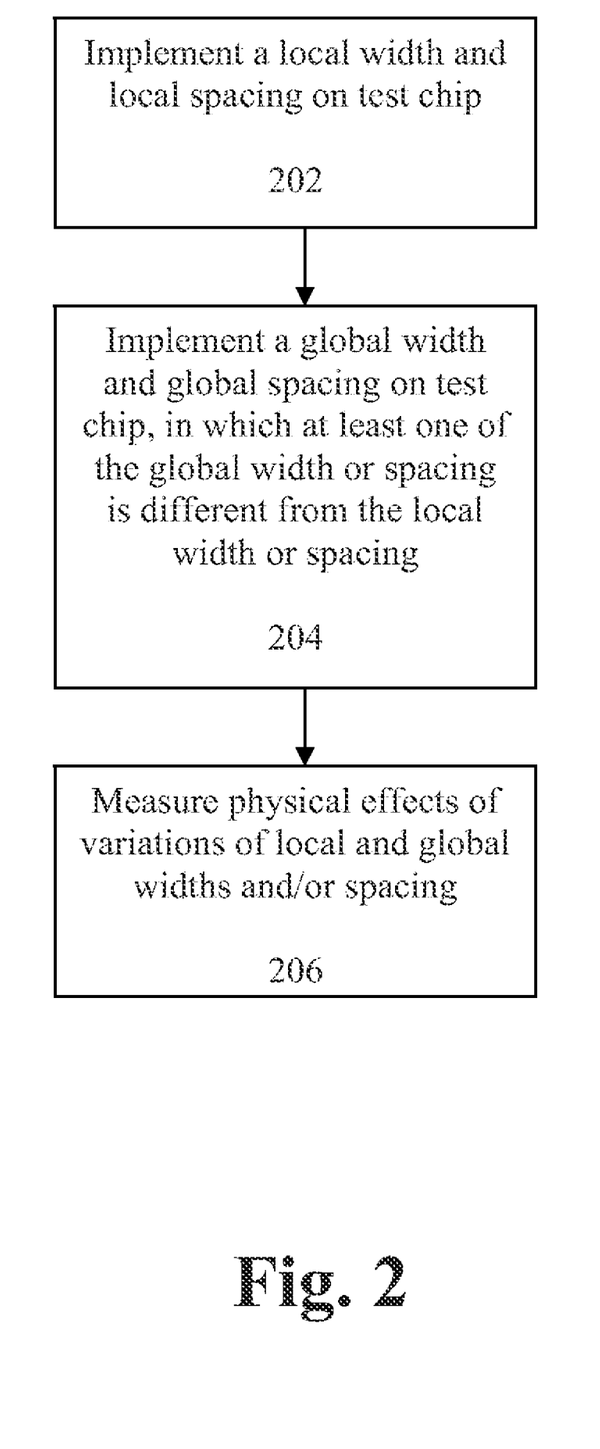
FIG. 2 is a process for implementing a test chip structure according to an embodiment of the invention.

FIG. 2 shows a process flow of a method for using a test structure according to some embodiments of the invention. This embodiment of the invention implants a test chip structure in which variations of wire width and wire spacing are modeled between local and distant wires.

At 202, wires having a local width and local spacing are implemented on the test chip structure. The local wires refer to a set of wires for which measurements are made to provide modeling of electrical characteristics. Any number of wires may be considered "local".

At 204, the non-local wires structures, referred to herein as "distant" wires, are implemented on the test structure. The distant wires form one or more sets of neighboring wires which may have differing width or spacing from the local wires. In 204, at least either, or both, of the width or spacing of the distant wires are different from either, or both, of the width or spacing of the local wires. In one approach, only the pitch of the wires are varied between the local and distant wires. In a second embodiment, only the width of the wires are varied between the local and distant wires. In a third embodiment, both the width and spacing are varied between the local and distant wires.

At 206, the physical effects of the variations of local and distant wires are measured to form the interconnect models. These interconnect models are used by IC designers to predict the electrical and timing characteristics of wires that appear in IC designs. In one embodiment, the interconnect models are employed and integrated within an EDA tool, such as an EDA verification or extraction tool.

Figure 3:
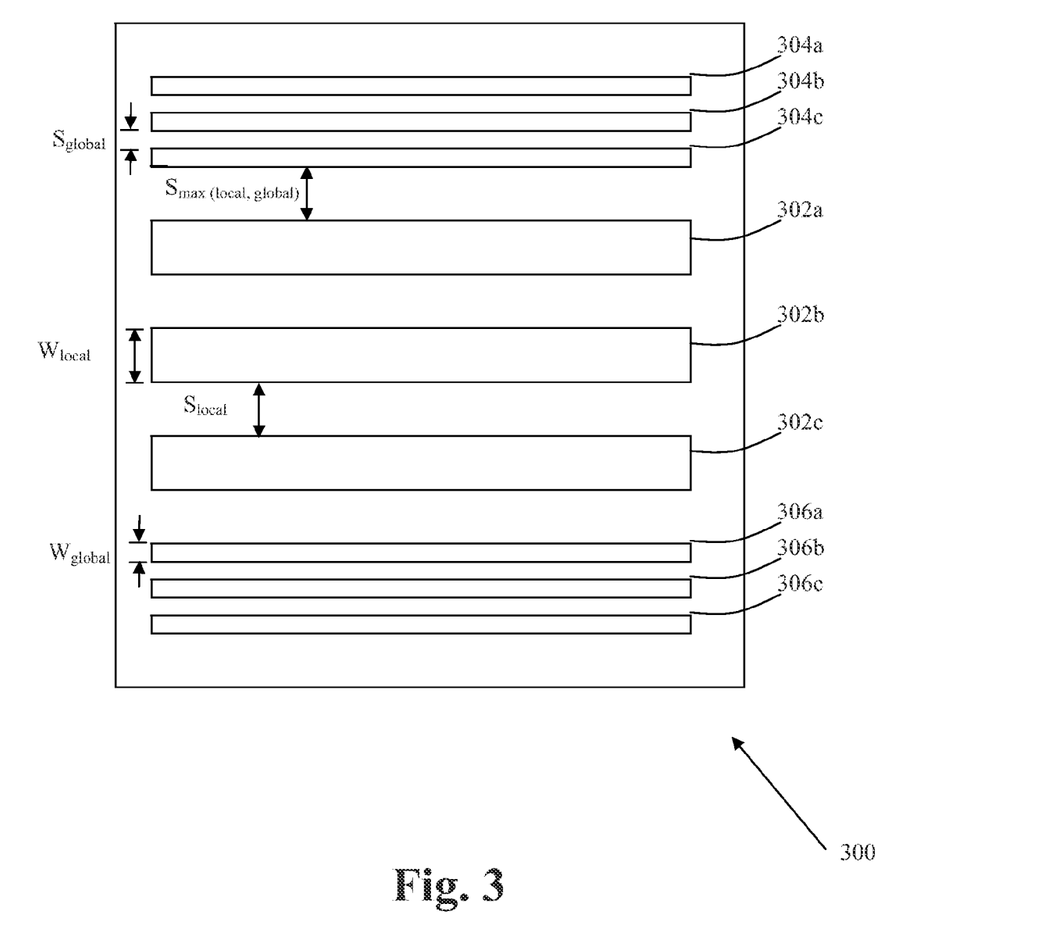
FIG. 3 illustrates an example test chip structure according to an embodiment of the invention.

FIG. 3 illustrates an example of a test structure 300 that includes variations between local and distant wires, according to some embodiments of the invention. Test chip structure 300 includes local wires 302a, 302b, and 302c. Test chip structure 300 also includes distant wires 304a, 304b, and 304c on one side of local wires 302a, 302b, and 302c. Distant wires 306a, 306b, and 306c are located on the other side of local wires 302a, 302b, and 302c. While not shown in FIG. 3, those of ordinary skill would recognize that additional circuitry would connect to the local wires to provide electrical measurements. Any suitable circuitry may be used in embodiments of the invention to provide electrical measurements of the local wires. In some embodiment, active circuitry may also be connected to the local wires.

Each of the local wires 302a, 302b, and 302c has a local width value Wlocal. Each of the local wires 302a, 302b, and 302c is also associated with a local spacing distance Slocal between each of the wires.

The distant wires 304a, 304b, 304c, 306a, 306b, and 306c each has a distant width value Wdistant. Each of the distant wires is also associated with a spacing distance Sdistant between each of the wires.

In one embodiment, the spacing between the distant and local wires is the maximum of either the local or distant spacing distances (Smax (local, distant)). In alternate embodiments, other spacing distance can also be employed between the local and distant wires. For example, the minimum of either the local or distant spacing distances may be employed as the spacing distance between local and distant wires. Other and additional spacing distances may also be employed.

In operation according to certain embodiments, a test structure would be designed and fabricated having variations between the local and distant widths and spacing distances, such as the variations in widths and spacing distances as illustrated in FIG. 3. The process rules and conditions for the fabricated test chip/test structures would be provided by a given fabrication facility. Different process rules and conditions would be provided by different fabrication facilities. The fabricated test structure would therefore include wires in which local wires have different widths and/or spacing distances from distant wires. Measurements are made of the electrical characteristics of the local wires. The measurement results are used to create one or more interconnect models that are specific for a set of fabrication processes and conditions.

Figure 4:
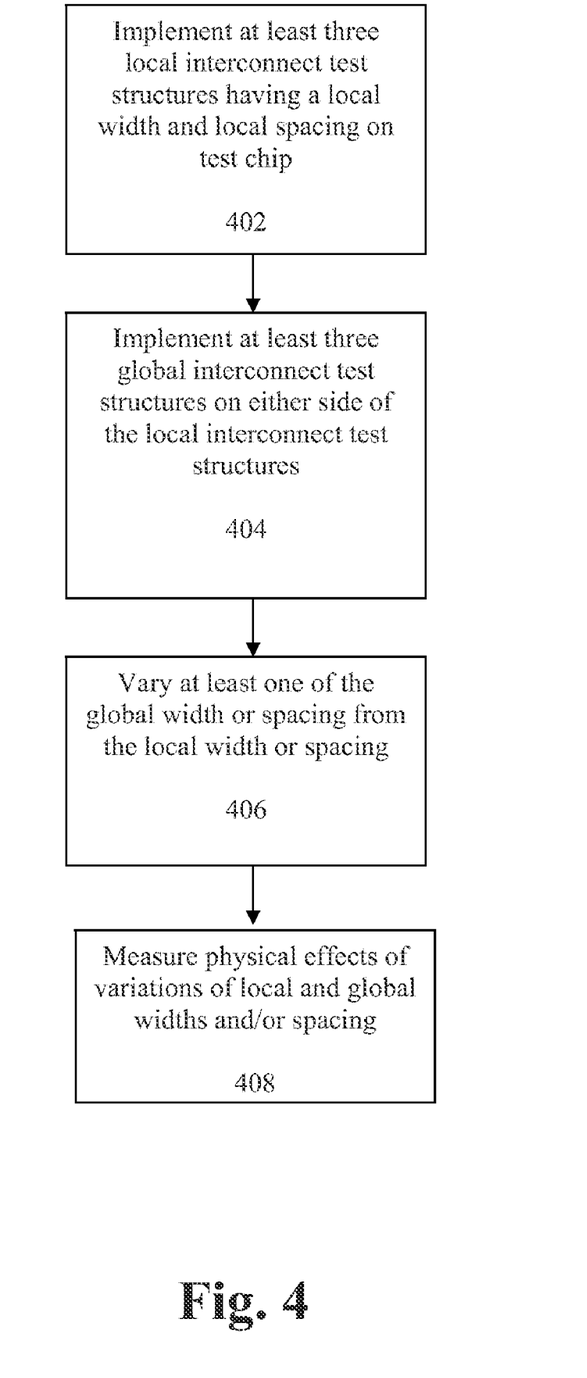
FIG. 4 is an alternate process for implementing a test chip structure according to an embodiment of the invention.

FIG. 4 shows a process flow of a method for implementing interconnect models according to an embodiment of the invention. At 402 the process implements at least three local interconnects having a local width for the interconnects. The local interconnects are also associated with a local spacing distance between each of the local interconnects.

At 404, the process implements at least three distant interconnects on either side of the local interconnects. The at least three distant interconnects on either side of the local wires have a distant width for the interconnects. The distant interconnects are also associated with a distant spacing distance between each of the distant interconnects.

Either, or both, of the wire spacing or wire widths are varied between the local wires and the distant wires (406). At 408, the physical effects of the variation of local and distant wire widths and/or spacing are measured and used to develop interconnect model(s).

Figure 5:
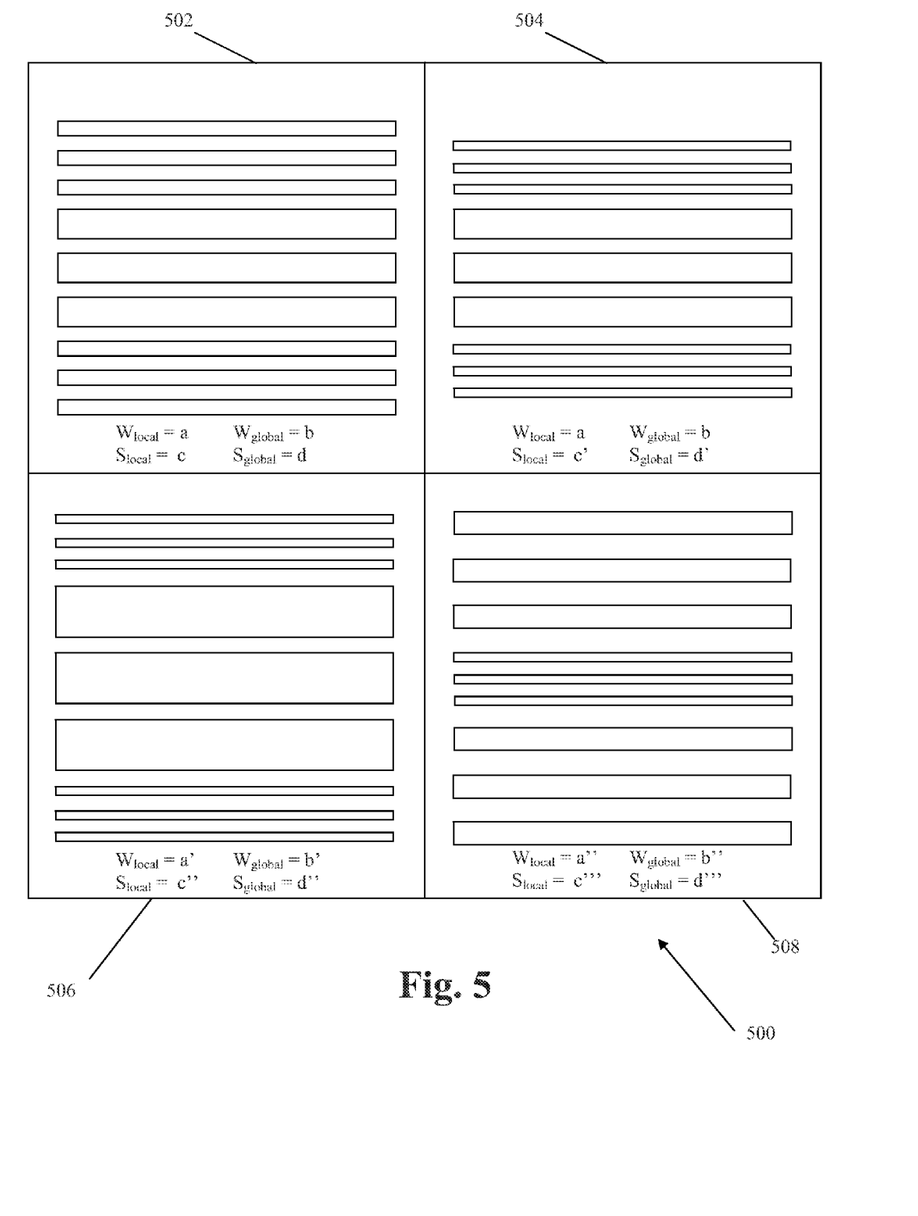
FIG. 5 illustrates an example test chip structure having multiple regions of different local and distant wire variations according to an embodiment of the invention.

A single test chip may contain multiple test structures (or regions) having different variations between local and distant physical characteristics. FIG. 5 illustrates an example test chip 500 having four test structures 502, 504, 506, and 508. Each of the test structures 502, 504, 506, and 508 has a different configuration of local and distant widths and spacing values. For example, test structure 502 is configured such that the width of the local wires is Wlocal=a and the width of the distant wires is a different value Wdistant=b. The spacing distances are configured in test structure 502 such that the local spacing distance Slocal=c and the distant spacing distance have the value Sdistant=d. Similarly, each of the other test structures 504, 506, and 508 has its own local and distant width and spacing values as indicated.

This type of test chip having different test structures permits a single test chip to provide measurement data for multiple different configurations of local and distant wires. The configuration of different regions should be designed such that the remote variations from one test structure do not affect the measurement results in a second test structure. Therefore, sufficient spacing distances should be configured between the wire structures in the different test structures to avoid non-desirable crosstalk and other electrical influence between the different test structures.

System Architecture Overview

Figure 6:
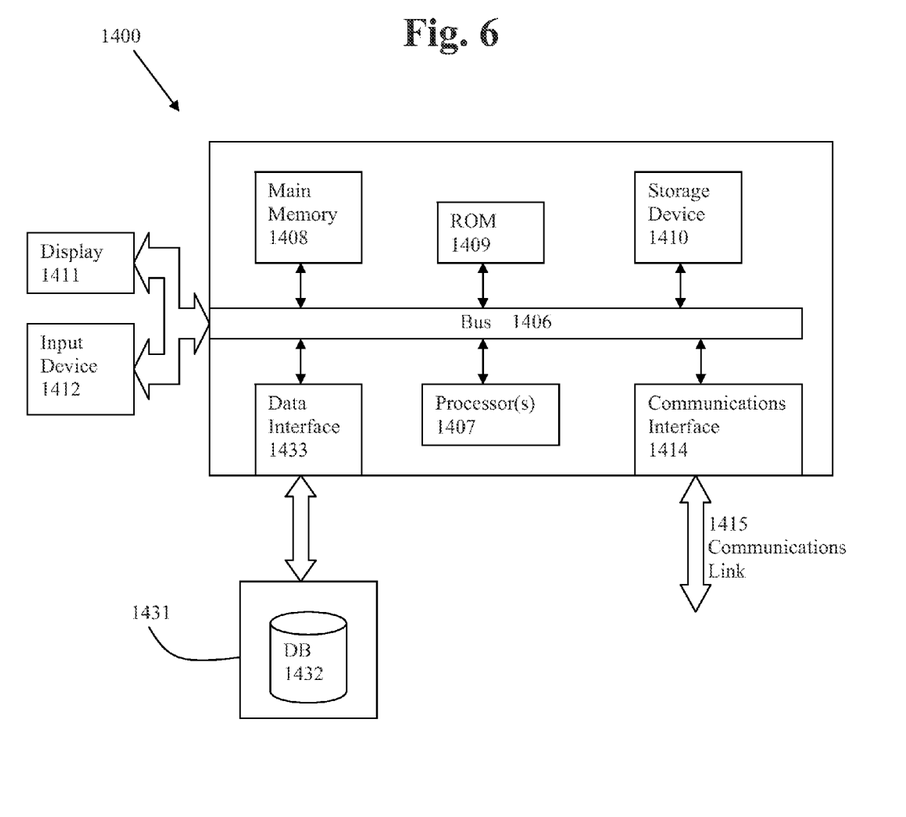
FIG. 6 illustrates an example computing architecture with which embodiments of the invention may be practiced.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is accessible by the computer system 1400. The computer system 1400 communicates with the date storage system 1431 through a data interface 1433. A data interface 1433, which is coupled to the bus 1406, transmits and receives electrical, electromagnetic or optical signals, that include data streams representing various types of signal information, e.g., instructions, messages and data.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A non-transitory computer accessible medium having stored thereupon a program which, when executed by at least one processor, causes the at least one processor to implement a method for modeling interconnects for integrated circuit designs using a test structure, the method comprising:

forming the test structure with variations in at least some of the at least three local interconnects or of the at least three distant interconnects, and forming an interconnect model based at least in part upon an effect, which is determined by using the at least one processor, of the variations on the test structure, wherein the test structure comprises:
- at least three local interconnects; and
- at least three distant interconnects on either side of the at least three local interconnects that are on a same layer as the at least three local interconnects, in which
  - the at least three local interconnects are associated with a first local interconnect width value and a first local interconnect spacing value, and a first distant interconnect of the at least three distant interconnects is associated with a first distant interconnect width value and a first distant interconnect spacing value, and
    - either or both of the first local interconnect width value and the first local interconnect spacing value are different from the first distant interconnect width value and the first distant interconnect spacing value.

2. The non-transitory computer accessible medium of claim 1, in which the test structure is placed on a test chip having multiple test structures, and some or all of the multiple test structures comprises a different configuration of the distant and local width and spacing values.

3. The non-transitory computer accessible medium of claim 1, in which the local interconnect width value is different from the distant interconnect width value, and the local spacing value is identical to the distant spacing value.

4. The non-transitory computer accessible medium of claim 1, in which the local interconnect width value is identical the distant interconnect width value, and the local spacing value is different from the distant spacing value.

5. The non-transitory computer accessible medium of claim 1, in which the local interconnect width value is different from the distant interconnect width value, and the local spacing value is different from the distant spacing value.

6. The non-transitory computer accessible medium of claim 1, in which one or more physical effects of the at least three local interconnects are measured to generate a physical effect measurement result that are further used to predict or estimate a timing characteristic of one or more wires of the integrated circuit design.

7. The non-transitory computer accessible medium of claim 1, wherein:
- the at least three local interconnects are associated with a second local interconnect width value, and
- the second local interconnect width value is different from the first local interconnect width value.

8. The non-transitory computer accessible medium of claim 1, wherein:
- the at least three local interconnects are associated with a second local interconnect spacing value, and
- the second local interconnect spacing value is different from the first local interconnect spacing value.

9. The non-transitory computer accessible medium of claim 1, wherein:
- the at least three distant interconnects are associated with a second distant interconnect spacing value, and
- the second distant interconnect spacing value is different from the first distant interconnect spacing value.

10. The non-transitory computer accessible medium of claim 1, wherein:
- the at least three distant interconnects are associated with a second distant interconnect width value, and
- the second distant interconnect width value is different from the first distant interconnect width value.

11. The non-transitory computer accessible medium of claim 1, in which a maximum spacing value among spacing between two adjacent local interconnects of the at least three local interconnects is used as a spacing between one of the at least three distant interconnects and an adjacent local interconnect of the at least three local interconnects.

12. A non-transitory computer accessible medium having stored thereupon a sequence of instructions which, when executed which, when executed by at least one processor, causes the at least one processor to implement a method for integrated circuit designs, the method comprising:
- forming the test structure with variations in at least some of the one or more local interconnects or of the one or more distant interconnects; and
- forming an interconnect model by using an effect, which is determined by using the at least one processor, of the variations on the test structure, wherein the test structure comprising:
  - one or more local interconnects; and
  - one or more distant interconnects on either side of the one or more local interconnects that are on a same layer as the one or more local interconnects, in which
    - the one or more local interconnects are associated with a first local interconnect width value and a first local interconnect spacing value and the one or more distant interconnects are associated with a first distant interconnect width value and a first distant interconnect spacing value, and
      - either or both of the first local interconnect width value and the first local interconnect spacing value are different from the first distant interconnect width value and the first distant interconnect spacing value.

13. The non-transitory computer accessible medium of claim 12 wherein the test structure is placed on a test chip, the test chip comprises multiple test structures, and some or all of the multiple test structures comprises a different configuration of the distant and local width and spacing values.

14. The non-transitory computer accessible medium of claim 12, in which:
- the local interconnect width value is different from the distant interconnect width value, and the local spacing value is identical to the distant spacing value; or
- the local interconnect width value is identical the distant interconnect width value, and the local spacing value is different from the distant spacing value; or
- the local interconnect width value is different from the distant interconnect width value, and the local spacing value is different from the distant spacing value; or
- one or more physical effects of the one or more local interconnects are measured to generate a physical effect measurement result that are further used to predict or estimate a timing characteristic of one or more wires of the integrated circuit design.

15. The non-transitory computer accessible medium of claim 12, wherein
- the one or more local interconnects are associated with a second local interconnect width value, and
- the second local interconnect width value is different from the first local interconnect width value.

16. The non-transitory computer accessible medium of claim 12, wherein:

the one or more local interconnects are associated with a second local interconnect spacing value, and the second local interconnect spacing value is different from the first local interconnect spacing value.

17. The non-transitory computer accessible medium of claim 12, wherein:

the one or more distant interconnects is associated with a second distant interconnect spacing value, and the second distant interconnect spacing value is different from the first distant interconnect spacing value.

18. A semiconductor device, comprising:

one or more local interconnects; and one or more distant interconnects on either side of the one or more local interconnects that are on a same layer as the one or more local interconnects, in which the one or more local interconnects is associated with a first local interconnect width value and a first local interconnect spacing value, and the one or more distant interconnects are associated with a first distant interconnect width value and a first distant interconnect spacing value, and either or both of the first local interconnect width value and the first local interconnect spacing value are different from the first distant interconnect width value and the first distant interconnect spacing value.

19. The semiconductor device of claim 18, wherein:

the local interconnect width value is different from the distant interconnect width value, and the local spacing value is identical to the distant spacing value;

the local interconnect width value is identical the distant interconnect width value, and the local spacing value is different from the distant spacing value;

the local interconnect width value is different from the distant interconnect width value, and the local spacing value is different from the distant spacing value; or one or more physical effects of the one or more local interconnects are measured to generate a physical effect measurement result that are further used to predict or estimate a timing characteristic of one or more wires of the integrated circuit design.

20. The semiconductor device of claim 18, wherein:

the one or more local interconnects are associated with a second local interconnect width value or a second local interconnect spacing value, and the second local interconnect width value is different from the first local interconnect width value or the second local interconnect spacing value is different from the first local interconnect spacing value.

\* \* \* \* \*